US012622319B2

(12) United States Patent
Wagner et al.

(10) Patent No.: US 12,622,319 B2
(45) Date of Patent: May 5, 2026

(54) STACKED DIE PACKAGING ARCHITECTURE WITH CONDUCTIVE VIAS ON INTERPOSER

(71) Applicant: Intel Corporation, Santa Clara, CA (US)

(72) Inventors: Thomas Wagner, Regelsbach (DE); Abdallah Bacha, Munich (DE); Vishnu Prasad, Munich (DE); Mohan Prashanth Javare Gowda, Ottobrunn (DE); Bernd Waidhas, Pettendorf (DE); Sonja Koller, Bavaria (DE); Eduardo De Mesa, Munich (DE); Jan Proschwitz, Riesa SN (DE); Lizabeth Keser, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 240 days.

(21) Appl. No.: 17/685,871

(22) Filed: Mar. 3, 2022

(65) Prior Publication Data

US 2023/0282615 A1    Sep. 7, 2023

(51) Int. Cl.
H01L 25/065 (2023.01)
H01L 23/00 (2006.01)
(Continued)

(52) U.S. Cl.
CPC ...... *H01L 25/0652* (2013.01); *H01L 23/3128* (2013.01); *H01L 23/49816* (2013.01); *H01L 23/49827* (2013.01); *H01L 23/5389* (2013.01); *H01L 24/16* (2013.01); *H01L 24/17* (2013.01); *H01L 24/32* (2013.01); *H01L 25/0657* (2013.01); *H01L 2224/16146* (2013.01); *H01L*

*2224/16227* (2013.01); *H01L 2224/17181* (2013.01); *H01L 2224/32225* (2013.01);
(Continued)

(58) Field of Classification Search
CPC ............. H01L 25/0652; H01L 23/3128; H01L 23/49816; H01L 23/49827; H01L 23/5389; H01L 24/16; H01L 24/17; H01L 24/32; H01L 25/0657; H01L 2224/16146; H01L 2224/1622; H01L 2224/17181; H01L 2224/32225; H01L 2225/06513; H01L 2225/06517; H01L 2924/15311; H01L 24/24; H01L 2225/06565; H01L 23/5384; H01L 23/5385; H01L 2225/06541
USPC ......................................................... 257/686
See application file for complete search history.

(56) References Cited

U.S. PATENT DOCUMENTS

2015/0102505 A1*   4/2015   Chung .................... H01L 24/97
                                                            438/109
2020/0321315 A1*  10/2020   Yu ......................... H01L 21/563
(Continued)

*Primary Examiner* — Norman D Richards
*Assistant Examiner* — Laura M Dykes
(74) *Attorney, Agent, or Firm* — Akona IP PC

(57)    ABSTRACT

A microelectronic assembly is provided, comprising: an interposer having a first side and a second side opposite to the first side; a plurality of integrated circuit (IC) dies in a plurality of layers on the first side of the interposer, the plurality of IC dies being encased by a dielectric material; a package substrate on the second side of the interposer; a plurality of conductive vias through the plurality of layers; and redistribution layers adjacent to the layers in the plurality of layers, at least some of the redistribution layers comprising conductive traces coupling the conductive vias to the IC dies.

20 Claims, 9 Drawing Sheets

(51) Int. Cl.
    *H01L 23/31*         (2006.01)
    *H01L 23/498*      (2006.01)
    *H01L 23/538*      (2006.01)

(52) U.S. Cl.
    CPC ............... *H01L 2225/06513* (2013.01); *H01L 2225/06517* (2013.01); *H01L 2924/15311* (2013.01)

(56)              References Cited

U.S. PATENT DOCUMENTS

2021/0159147 A1*   5/2021   Lin ..................... H01L 23/3121
2021/0305223 A1*   9/2021   Shih ........................ H01L 24/96
2022/0320043 A1*  10/2022  Yoo ........................ H01L 24/17

\* cited by examiner

5/9

STACKED DIE PACKAGING ARCHITECTURE WITH CONDUCTIVE VIAS ON INTERPOSER

TECHNICAL FIELD

The present disclosure relates to techniques, methods, and apparatus directed to a stacked die packaging architecture with conductive vias on interposer.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
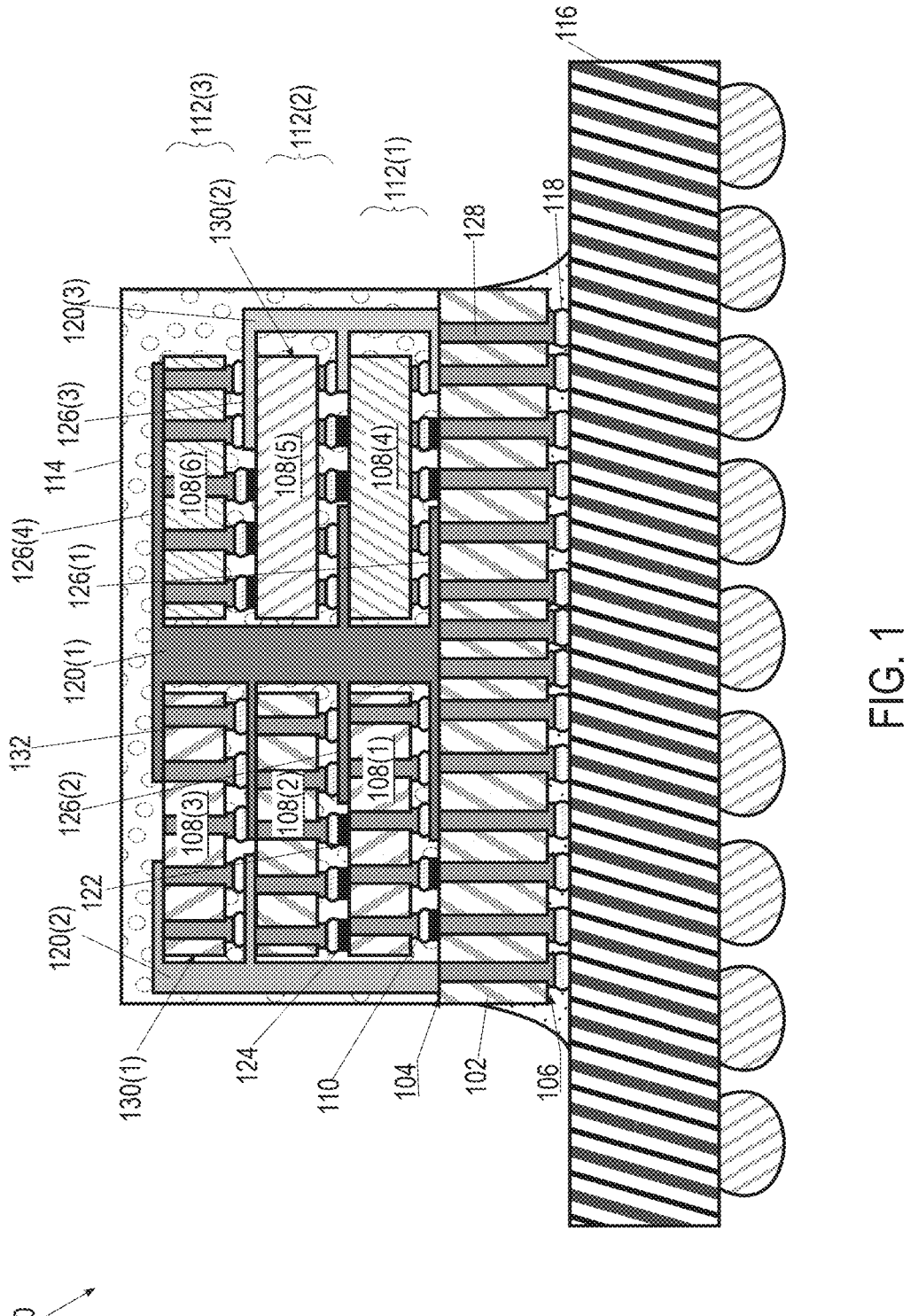
FIG. 1 is a simplified cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

High computing processors (e.g., central processing units (CPUs), graphics processing units (GPU)), servers, and field-programmable gate arrays (FPGAs)) typically use multiple IC dies in a single package. In some packages, the IC dies are arranged laterally and also stacked vertically in a 2.5D or 3D type of packaging architecture. In 2.5D or 3D packaging architecture, with a base die on the bottom and other IC dies on top, the IC dies on top of the base die communicate laterally with each other using bridge dies (e.g., Intel's embedded multi-die interconnect bridge EMIB™) or in a stacked die arrangement (e.g., Intel's Foveros™) with through-substrate vias (TSVs) in the underlying die, or in a stacked package-like arrangement (e.g., Intel's omni-directional interconnects (ODI)) with through-mold vias (TMVs) in a mold material surrounding the base die inside an interposer structure. As used herein, the term "interposer" refers to any cohesive (e.g., unbroken, continuous, singular) structure that provides mechanical and electrical coupling between an IC die and a package substrate in a microelectronic assembly and that occupies at least as large an area as the IC die. Much larger than traditional TSVs, the large TMVs have lower resistance, providing more robust power delivery simultaneously with higher bandwidth and lower latency enabled through stacking. At the same time, this approach may reduce the number of TSVs required in the base die, freeing up more area for active transistors and optimizing die size.

However, in an arrangement of stacked IC dies over the base die of the interposer, such TMVs are not useful for IC dies on top of the die stack unless the IC dies on top of the die stack extend beyond a boundary (e.g., periphery, border, edge, footprint, etc.) of the base die. Using a redistribution layer (RDL) to connect the TMVs in the interposer to the die stack also does not serve to alleviate the problem of power supply to the IC dies on top of the die stack. In other words, in current packaging technologies, power and ground may be coupled to the top IC dies in a die stack only through TSVs in the underlying IC dies.

In this regard, some embodiments of the present disclosure alleviate such problems by providing a microelectronic assembly comprising an interposer having a plurality of IC dies stacked in a plurality of layers on a first side of the interposer and a package substrate on a second side of the interposer opposite to the first side, the plurality of IC dies being encased by a dielectric material, such as a mold compound. The microelectronic assembly further comprises a plurality of conductive vias through the plurality of layers, and a plurality of conductive traces between adjacent layers, at least some of the conductive traces coupling the conductive vias to the IC dies. The conductive vias, which may comprise copper pillars in some embodiments, may be of varying diameters to be accommodated in the regions around the stacks of IC dies. The conductive vias, which may comprise TMVs where the dielectric material is mold compound, can have varying heights as well, according to placement and connection requirements as appropriate.

In various embodiments, plating processes that allow large aspect ratios of metal pillars reaching several hundreds of micrometers in height with only a few micrometers in diameter may be used to fabricate the conductive vias. Embodiments of the microelectronic assembly as described may be used in high-bandwidth memory applications, for example, where a stack of IC dies is coupled to a base die and/or interposer. Power may be delivered to this stack of IC dies by conductive pillars fabricated on the interposer in the space between the IC dies (e.g., lateral to the IC die stack). Electrical connections to the conductive vias may be provided through TSVs in the interposer. In addition, as the conductive vias are electrically isolated from each other, they may facilitate different power supplies, ground, or signal connections to various IC dies in the stacks as appropriate and based on particular needs.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a simplified cross-sectional view of a microelectronic assembly 100 according to some embodiments of the present disclosure. Microelectronic assembly 100 comprises components in several non-coplanar layers as shown. At a base layer is an interposer 102. In some embodiments, interposer 102 comprises an IC die without active components. In some embodiments, interposer 102 comprises an IC die with active components. In various embodiments, interposer 102 comprises one of silicon, ceramic, and glass. Any suitable inorganic material may be used in interposer 102.

Interposer 102 has a first face 104 and a second face 106 opposite to first face 104. A plurality of IC dies 108 (e.g., 108(1), 108(2), . . . 108(6)) (singly "IC die 108") may be coupled by interconnects 110 in a plurality of layers 112 (e.g., 112(1), 112(2), 112(3)) located on first face 104. In various embodiments, interconnects 110 may comprise DTD interconnects, for example, having a pitch of less than 50 micrometers between adjacent ones of the interconnects. In the example embodiment shown, three layers 112, i.e., 112(1), 112(2) and 112(3), are included only for illustrative purposes and not as a limitation. Any number of layers 112 comprising IC dies 108 may be included in microelectronic assembly 100 within the broad scope of the embodiments.

The plurality of IC dies 108 is encased by a dielectric material 114. In various embodiments, dielectric material 114 comprises a mold compound. In other embodiments, dielectric material may comprise polyimide or any other suitable organic material. In some embodiments, dielectric material 114 may be the same in one or more of layers 112, and different in other ones of layers 112. For example, dielectric material 114 may comprise polyimide in layer 112(1) and epoxy mold compound in layer 112(2); in another example, dielectric material 114 may comprise different material compositions in different layers, such as spherical silica-filled epoxy in layer 112(1), silica nanoparticle-filled epoxy in layer 112(2), crystal silica-filled epoxy in layer 112(3), etc. In other embodiments, dielectric material 114 may comprise the same material and/or material composition in substantially all layers 112. In various embodiments, the plurality of IC dies 108 and dielectric material 114 may be contained within a boundary of interposer 102. A package substrate 116 may be coupled to interposer 102 on second face 106 by interconnects 118. In some embodiments, interconnects 118 may comprise DTPS interconnects. In an example embodiment, interconnects 118 may have a pitch of 100 micrometers or larger. In various embodiments, interconnects 110 between IC dies 108 may have a smaller pitch than the pitch of interconnects 118 between interposer 102 and package substrate 116.

In various embodiments, a plurality of conductive vias 120 (e.g., 120(1), 120(2), 120(3)) through the plurality of layers 112 may be located on first face 104 of interposer 102. In various embodiments, any suitable conductive metal may be used in conductive vias 120, including copper, aluminum, gold, nickel, etc. Three conductive vias 120 are shown in the figure merely for illustrative purposes; any number of conductive vias 120 may be included in microelectronic assembly 100 within the broad scope of the embodiments. In some embodiments, some (e.g., a subset) of conductive vias 120 (e.g., 120(1), 120(2)) have larger diameters than other conductive vias 120 (e.g., 120(3)); in other embodiments, substantially all conductive vias 120 have the same diameter. In an example embodiment, some conductive vias 120 may have a diameter of 10 micrometers; in another example embodiment, some conductive vias 120 may have a diameter of 100 micrometers. In various embodiments, different conductive vias 120 may have different heights; for example, some (e.g., a subset) conductive vias 120 (e.g., 120(1), 120(2)) extend through a portion of the plurality of layers 112 (e.g., 112(1), 112(2) and 112(3)), and other (e.g., another subset) conductive vias 120 (e.g., 120(3)) extend through another portion of the plurality of layers 112 (e.g., 112(1) and 112(2) only), depending on electrical coupling needs and other requirements. In an example embodiment, some conductive vias 120 may have a height of 100 micrometers and a diameter of 10 micrometers.

In some embodiments, some conductive vias 120 (e.g., 120(1)) are configured to carry power, some conductive vias 120 (e.g., 120(2)) are configured to carry signals, and some conductive vias (e.g., 120(3)) are configured to connect to ground. In some embodiments, some conductive vias (e.g., 120(1)) are configured to operate at a first voltage (e.g., VDD1), some conductive vias (e.g., 120(2)) are configured to operate at a second voltage (e.g., VDD2 or VSS) different from the first voltage. In some embodiments, some conductive vias 120 (e.g., 120(2), 120(3)) are distributed around the plurality of IC dies 108 in a peripheral region of dielectric material 114, for example, proximate to the boundary of interposer 102, and some conductive vias 120 (e.g., 120(1)) are distributed laterally between the plurality of IC dies 108 in a medial region of dielectric material 114, for example, toward a center of interposer 102.

RDLs 122 (singly "RDL 122"), including conductive bond pads 124 and conductive traces 126 (e.g., 126(1), . . . 126(4)) (also referred to as "fins" of conductive vias 120), may be provided adjacent to layers 112 for electrical coupling. For example, conductive traces 126(1) adjacent to layer 112(1) and interposer 102 may be coupled to TSVs 128 in interposer 102. TSVs 128 may facilitate power, ground, and signal connections to conductive vias 120. Other conductive traces 126, for example, between (or above, or below) layers 112 may couple conductive vias 120 to IC dies 108 appropriately. For example, in the embodiment shown, conductive traces 126(2) may be located between layers 112(1) and 112(2), with some of conductive traces 126(2) coupling IC die 108(1) to conductive via 120(1) and other ones of conductive traces 126(2) coupling IC die 108(4) to conductive via 120(3); some of conductive traces 126(3) located between layers 112(2) and 112(3) may couple IC die 108(2) to conductive via 120(1), other ones of conductive traces 126(3) may couple IC die 108(2) to conductive via 120(2), and yet other ones of conductive traces 126(3) may couple IC die 108(5) to conductive via 120(3); some of conductive traces 126(4) may couple IC die 108(3) to conductive via 120(1), other ones of conductive traces 126(4) may couple IC die 108(3) to conductive via 120(2), and yet other ones of conductive traces 126(4) may couple IC die 108(6) to conductive via 120(1). Many other configurations are possible and included within the broad scope of the embodiments.

In various embodiments, IC dies 108 may form separate stacks 130 through layers 112, for example, with IC dies 108 arranged vertically one over the other in each stack 130. In the embodiment shown, two distinct stacks 130(1) and 130(2) are shown merely for illustrative purposes and not as limitations. Any number of stacks 130 may be included in microelectronic assembly 100 within the broad scope of the embodiments. Stack 130(1) in the embodiment shown comprises IC die 108(1)-108(3), and stack 130(2) comprises IC dies 108(4)-108(6). Stacks 130 may be coupled to interposer 102 by interconnects 110. In some embodiments, some stacks 130 may comprise different number of IC dies than other stacks 130. In other embodiments, all stacks 130 may have the same number of IC dies 108.

In some embodiments, one or more of IC dies 108 may comprise TSVs 132. For example, IC dies 108(1) may be coupled to interposer 102 with its front (e.g., metallization stack) adjacent to interposer 102 and its back on the opposite side, adjacent to the interface with IC die 108(2), in which case, TSVs 132 may facilitate electrical coupling of certain active regions and the metallization stack in IC die 108(1) to conductive traces 126(2) on the back.

Figure 2:
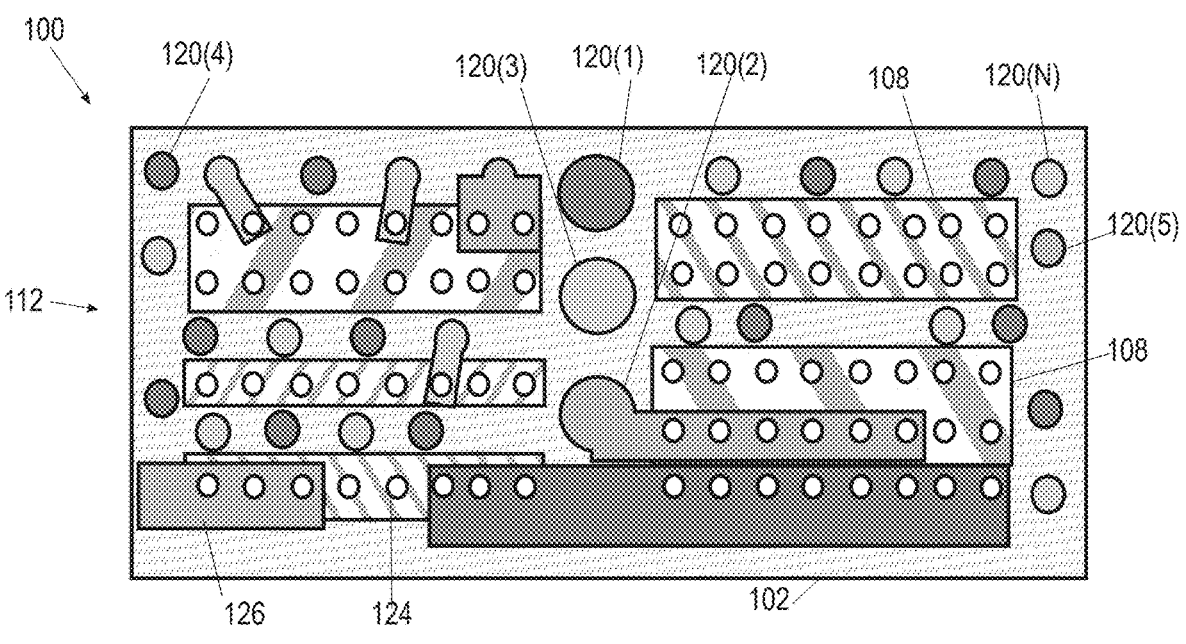
FIG. 2 is a simplified top view of a section of an example microelectronic assembly according to some embodiments of the present disclosure.

FIG. 2 is a simplified top view of a slice in a layer 112 of an embodiment of microelectronic assembly 100. Plurality of conductive vias 120 (e.g., 120(1), . . . 120(N)) may be coupled to IC dies 108 by conductive traces 126. Bond pads 124 may enable coupling IC dies 108 to RDL 122. Some conductive vias 120 may be larger than other conductive vias 120. Some conductive vias 120 may operate at one voltage (e.g., VDD1), and other conductive vias 120 may operate at a different voltage (e.g., VDD2 or VSS). Some conductive vias 120 may carry signals, and other conductive vias 120 may carry power or be coupled to ground. Some conductive traces 126 may couple conductive via 120 to one bond pad 124; some conductive traces 126 may couple conductive via 120 to multiple bond pads 124, some of which are coupled to one IC die 108 and others are coupled to another IC die 108. Some conductive vias 120 may not be coupled to any IC die 108 in layer 112 shown but may be coupled to one or more IC dies 108 in another layer (not shown).

Figure 3:
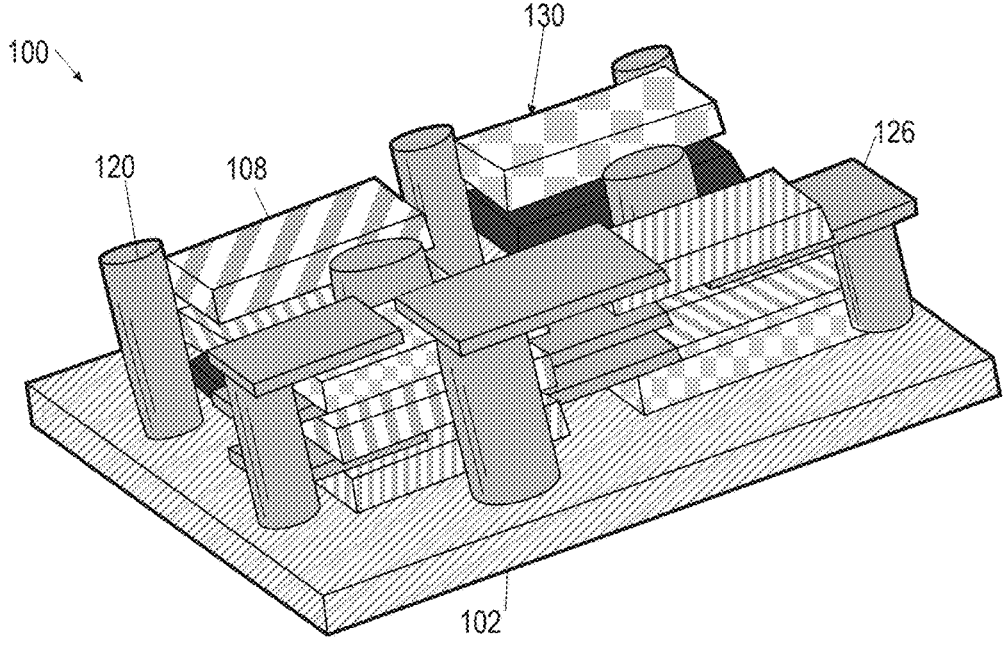
FIG. 3 is a simplified perspective view of a portion of yet another example microelectronic assembly according to some embodiments of the present disclosure.

FIG. 3 is a perspective view of a portion of microelectronic assembly 100. Conductive vias 120 may be interspersed around stacks 130 comprising IC dies 108, with conductive traces 126 coupling conductive vias 120 to individual IC dies 108. The diameter and height of conductive vias 120 may differ according to the available spacing, functionalities, and electrical coupling needs of microelectronic assembly 100. For example, if stacks 130 are spaced close together, conductive vias 120 between stacks 130 toward a medial region of microelectronic assembly 100 may have a smaller diameter and may be less numerous than conductive vias 120 along a periphery of stacks 130, proximate to a boundary of interposer 102. Note that although the four different stacks 130 shown in the figure have the same number of IC dies 108 (namely 3), this is merely for illustrative purposes and should not be construed as a limitation. Stacks 130 may comprise any number of IC dies 108, and different stacks 130 may have correspondingly different number of IC dies 108, within the broad scope of the embodiments.

Figures 4A, 4B, 4C, 4D:
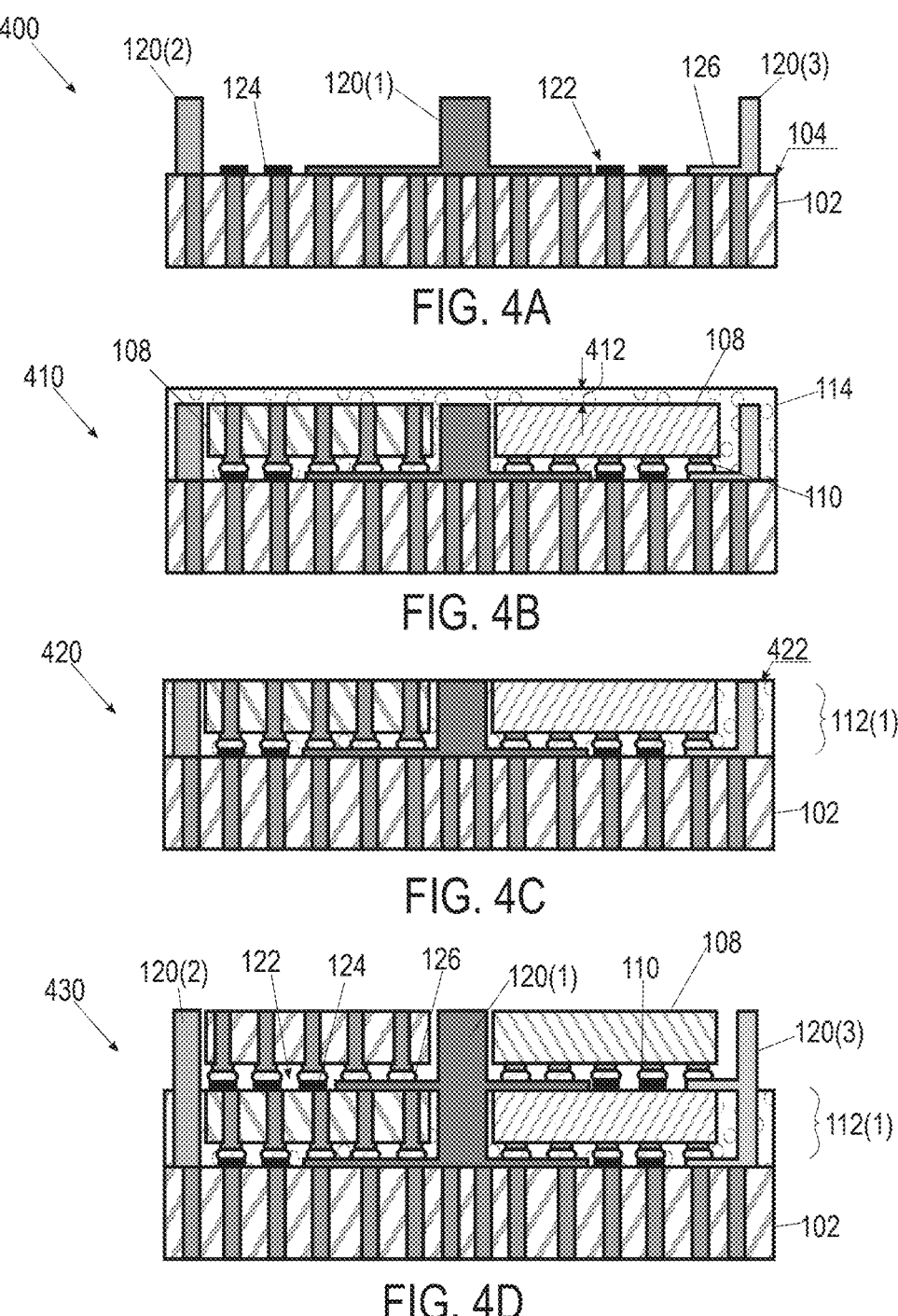
FIGS. 4A-4F are simplified cross-sectional views of various stages of manufacture of an example microelectronic assembly, according to some embodiments of the present disclosure.

FIGS. 4A-4F are simplified cross-sectional views of various stages of manufacture of an example embodiment of microelectronic assembly 100. FIG. 4A shows an assembly 400 comprising interposer 102 having face 104 over which conductive metal has been deposited to form RDL 122 with bond pads 124 and conductive traces 126. In some embodiments, a seed layer may be deposited before depositing RDL 122, for example, to enhance adhesion of the conductive metal comprising RDL 122 to interposer 102. Conductive vias 120 (e.g., 120(1), . . . 120(3)) may be deposited over RDL 122, for example, by electrodeposition. In some embodiments, a photoresist may be used during the electrodeposition process to create the shapes of individual RDL 122 and conductive vias 120. In various embodiments, RDL 122 and conductive vias 120 may comprise copper.

FIG. 4B shows an assembly 410 subsequent to attaching IC dies 108 to bond pads 124 and encapsulating with dielectric material 114. In some embodiments (as shown) the amount of dielectric material 114 deposited over IC dies 108 may be such as to have excess material 412 above IC dies 108, for example, to ensure that all regions have been entirely covered by dielectric material 114.

FIG. 4C shows an assembly 420 subsequent to completing layer 112(1). Excess material 412 is removed, for example, by chemical mechanical polishing (CMP) or backgrinding, and surface 422 (e.g., topside) is exposed on a side of layer 112(1) opposite to interposer 102.

FIG. 4D shows an assembly 430 subsequent to forming RDL 122 over surface 422 of layer 112(1) and attaching IC dies 108 to bond pads 124 thereon. Conductive vias 120 may be extended further in height (e.g., grown) based on particular needs. In the embodiment shown, conductive vias 120 are grown over existing locations of conductive vias 120 in previously deposited layer 112(1). Such a configuration may result in conductive vias 120 in adjacent layers sharing a common center. In some embodiments, conductive vias 120 may be deposited in a location different from conductive vias 120 in the previously deposited layer 112(1) and coupled by conductive traces 126 of RDL 122. Such a configuration may result in a staggered arrangement of conductive vias 120 in adjacent layers 112.

Figure 4E:
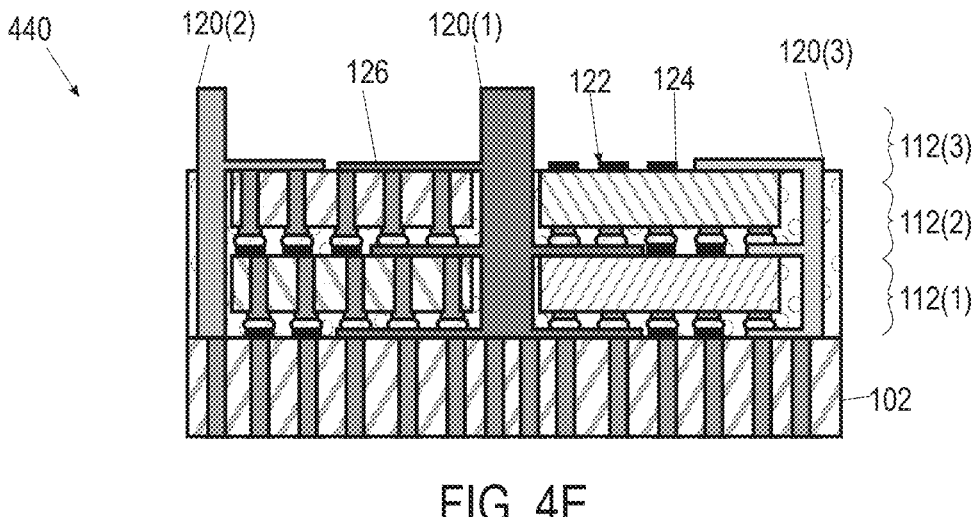

FIG. 4E shows an assembly 440 subsequent to completing layer 112(2) over layer 112(1) and partially forming layer 112(3) over layer 112(2). In various embodiments, layer 112(2) may be completed by encapsulating IC dies 108 coupled in the previous operation by dielectric material 114 and grinding away excess material as in FIG. 4C, followed by deposition of the next RDL 122 on the exposed surface and growing conductive vias 120 as appropriate. In the example embodiment shown, conductive via 120(3) is not grown further in this operation, because it does not extend into layer 112(3).

Figure 4F:
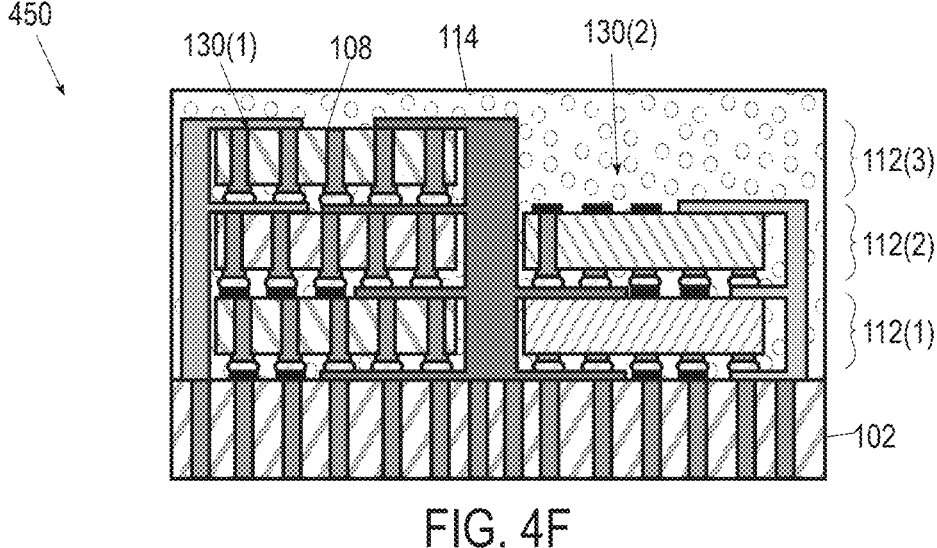

FIG. 4F shows an assembly 450 subsequent to completing microelectronic assembly 100. IC dies 108 of layer 112(3) may be coupled to bond pads 124, followed by encapsulation with dielectric material 114. At the end of the operations, stacks 130 may comprise different numbers of IC dies 108 based on particular needs. For example, in assembly 450 shown, stack 130(1) has three IC dies 108, and stack 130(2) has two IC dies 108. Any number of layers 112 and any number of IC dies 108 may be included within the broad scope of the embodiments. Assembly 450 may be subsequently diced to separate individual units of microelectronic assembly 100.

Figures 5A, 5B, 5C:
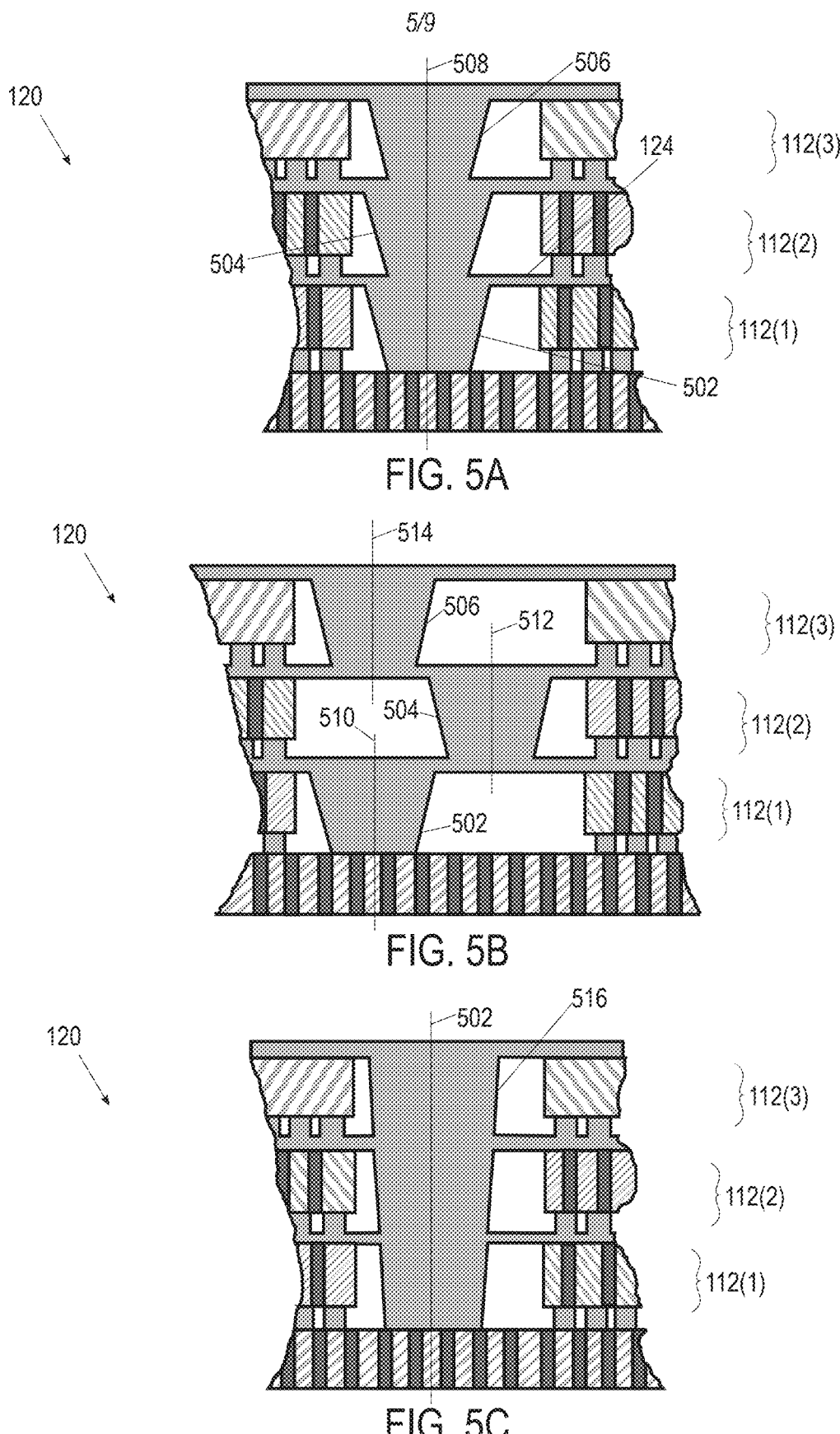
FIGS. 5A-5C are simplified cross-sectional views of details in different embodiments of the microelectronic assembly.

FIG. 5A is a simplified cross-sectional detail of conductive via 120 in an embodiment of microelectronic assembly 100. In some embodiments, conductive vias 120 may be formed after encapsulation of IC dies 108 with dielectric material 114, for example, by a through-hole via process of etching dielectric material 114 and subsequent metal plating in the etched through-hole. In such embodiments, conductive vias 120 may have a distinctive flared cross-section in which the top is broader than the bottom as shown in simplified form in the figure. Further, conductive via 120 may comprise portions 502, 504 and 506 that extend through layers 112(1), 112(2) and 112(3) respectively, each portion being formed subsequent to forming the respective layers. For example, portion 502 is formed after completion of layer 112(1); portion 504 is formed after completion of layer 112(2); and so on. Portions 502 and 504 are in contact with each other, and portions 504 and 506 are in contact with each other. In the embodiment shown in the figure, portions 502, 504 and 506 have a common center 508.

FIG. 5B is a simplified cross-sectional detail of conductive via 120 in another embodiment of microelectronic assembly 100. Conductive via 120 may comprise portions 502, 504 and 506 that extend through layers 112(1), 112(2) and 112(3) respectively. In the embodiment shown in the figure, portions 502, 504 and 506 have different centers 510, 512, and 514, respectively. Such a staggered arrangement of conductive via 120 may result in a mechanically stronger and more reliable structure.

FIG. 5C is a simplified cross-sectional detail of conductive via 120 in yet another embodiment of microelectronic assembly 100. Conductive via 120 may comprise a unitary through-hole via 516 having a center 508 that extends through layers 112(1), 112(2) and 112(3). In such embodiments, conductive via 120 may be formed after completion of the plurality of layers 112, with etching through all the plurality of layers 112 in one process step and plating the resulting through-hole. In such embodiments, the size of conductive via 120 may be limited by possible aspect ratios achievable with the etching process.

Figures 6A, 6B, 6C:
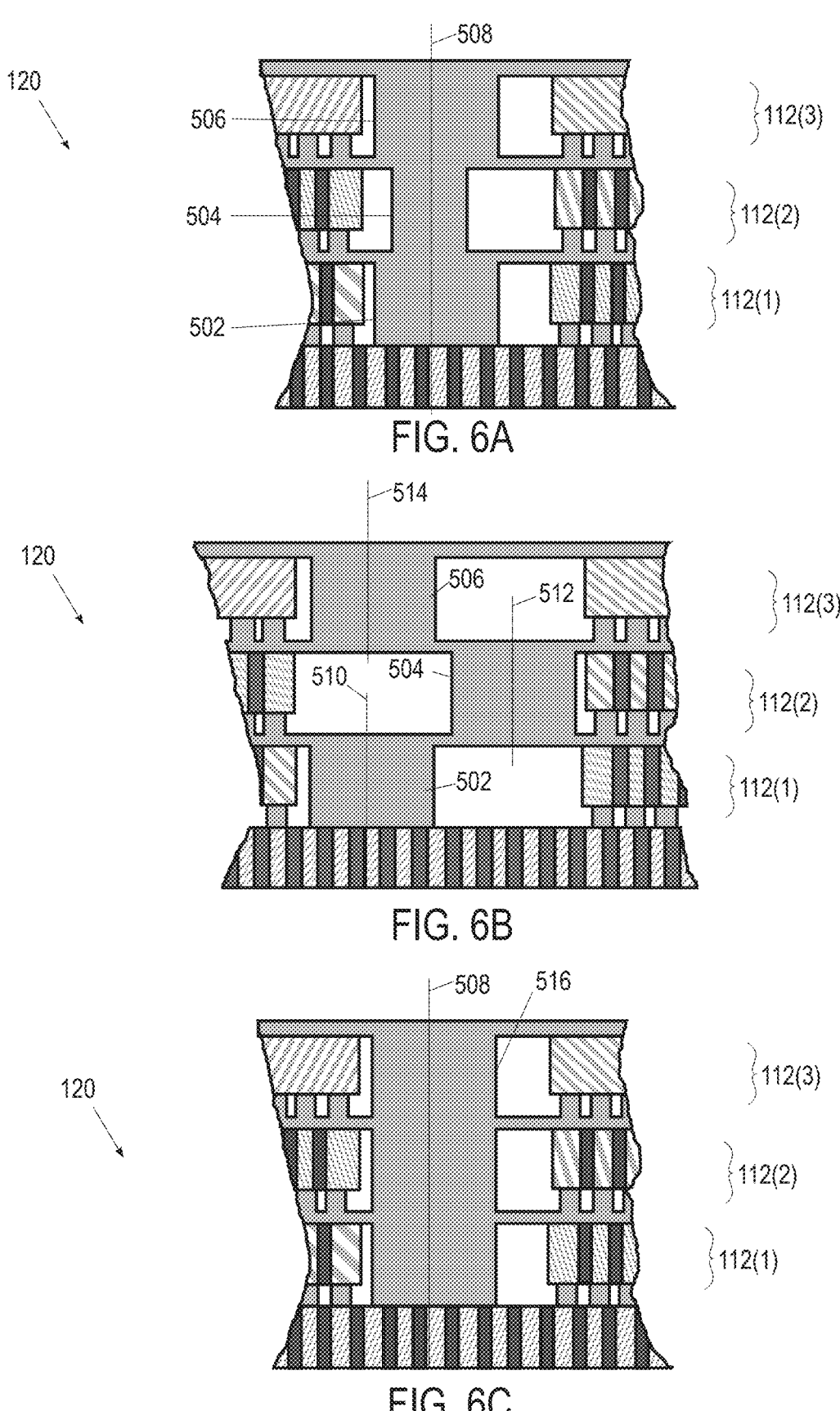
FIGS. 6A-6C are simplified cross-sectional views of details in different embodiments of the microelectronic assembly.

FIG. 6A is a simplified cross-sectional detail of conductive via 120 in an embodiment of microelectronic assembly 100. In some embodiments as described in reference to FIGS. 4A-4E, conductive vias 120 may be formed for example, by electrodeposition over RDL 122 before depositing dielectric material 114 in the respective layer 112. In such embodiments, conductive vias 120 may have a distinctive pillar (or cylinder) shape with parallel walls. Further, conductive via 120 may comprise portions 502, 504 and 506 that extend through layers 112(1), 112(2) and 112(3) respectively, each portion being formed before depositing dielectric material 114 in the respective layers. For example, portion 502 is formed before depositing dielectric material 114 of layer 112(1); portion 504 is formed before depositing dielectric material 114 of layer 112(2); and so on. In such embodiments, portions 502-506 in respective layers 112(1)-112(3) may not necessarily have the same diameter, for example, because they are formed in different process steps. Portions 502 and 504 are in contact with each other, and portions 504 and 506 are in contact with each other. In the embodiment shown in the figure, portions 502, 504 and 506 have a common center 508.

FIG. 6B is a simplified cross-sectional detail of a conductive via 120 in another embodiment of microelectronic assembly 100. Conductive via 120 may comprise portions 502, 504 and 506 that extend through layers 112(1), 112(2) and 112(3) respectively. In the embodiment shown in the figure, portions 502, 504 and 506 have different centers 510, 512, and 514, respectively. Such a staggered arrangement of conductive via 120 may result in a mechanically stronger and more reliable structure.

FIG. 6C is a simplified cross-sectional detail of a conductive via 120 in yet another embodiment of microelectronic assembly 100. Conductive via 120 may comprise a unitary through-hole via 516 having a center 508 that extends through layers 112(1), 112(2) and 112(3). In such embodiments, conductive via 120 may be formed as a pillar that has a height greater than or equal to the combined thickness of the plurality of layers 112(1)-112(3) before depositing dielectric material 114 in any layer 112. Thereafter, dielectric material 114 of layers 112(1)-112(3) may be deposited around the pillar in sequential operations associated with forming individual layers 112(1)-112(3). In such embodiments, the diameter of conductive via 120 may be limited by possible aspect ratios achievable with the deposition process.

In various embodiments, any of the features discussed with reference to any of FIGS. 1-6C herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 7:
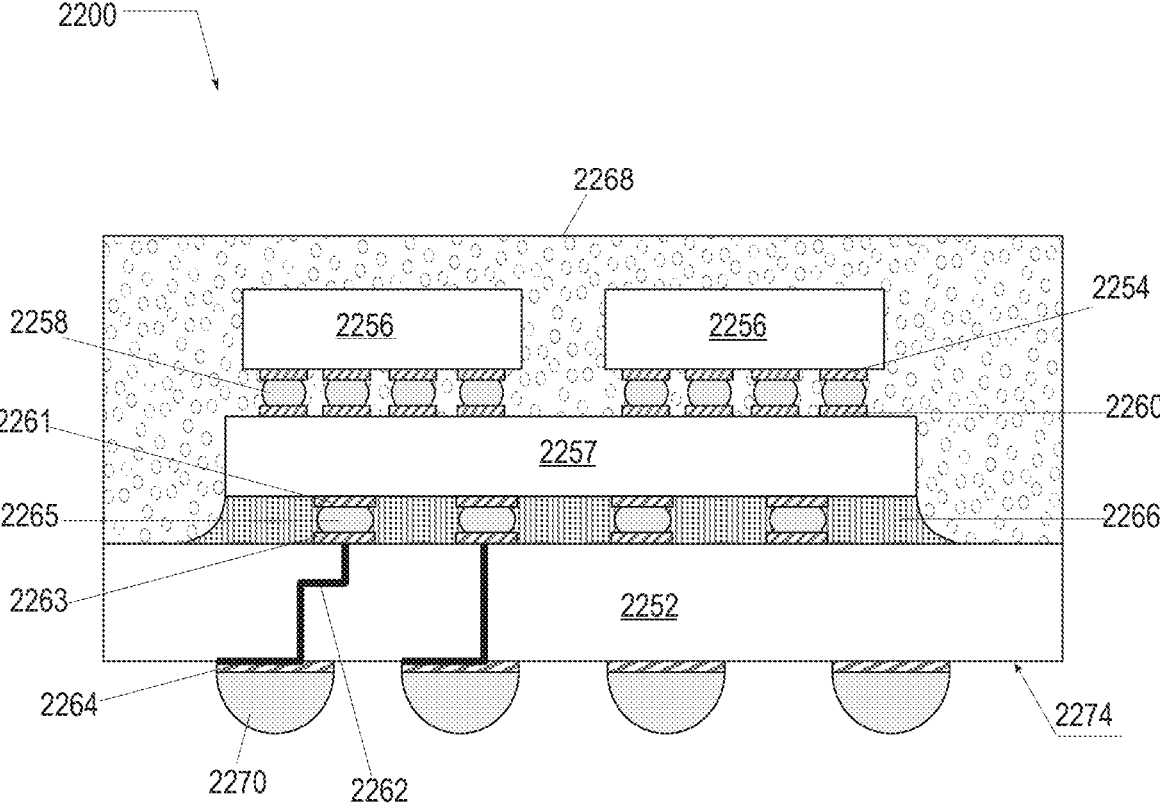
FIG. 7 is a cross-sectional view of a device package that includes one or more microelectronic assemblies in accordance with any of the embodiments disclosed herein.
Figure 8:
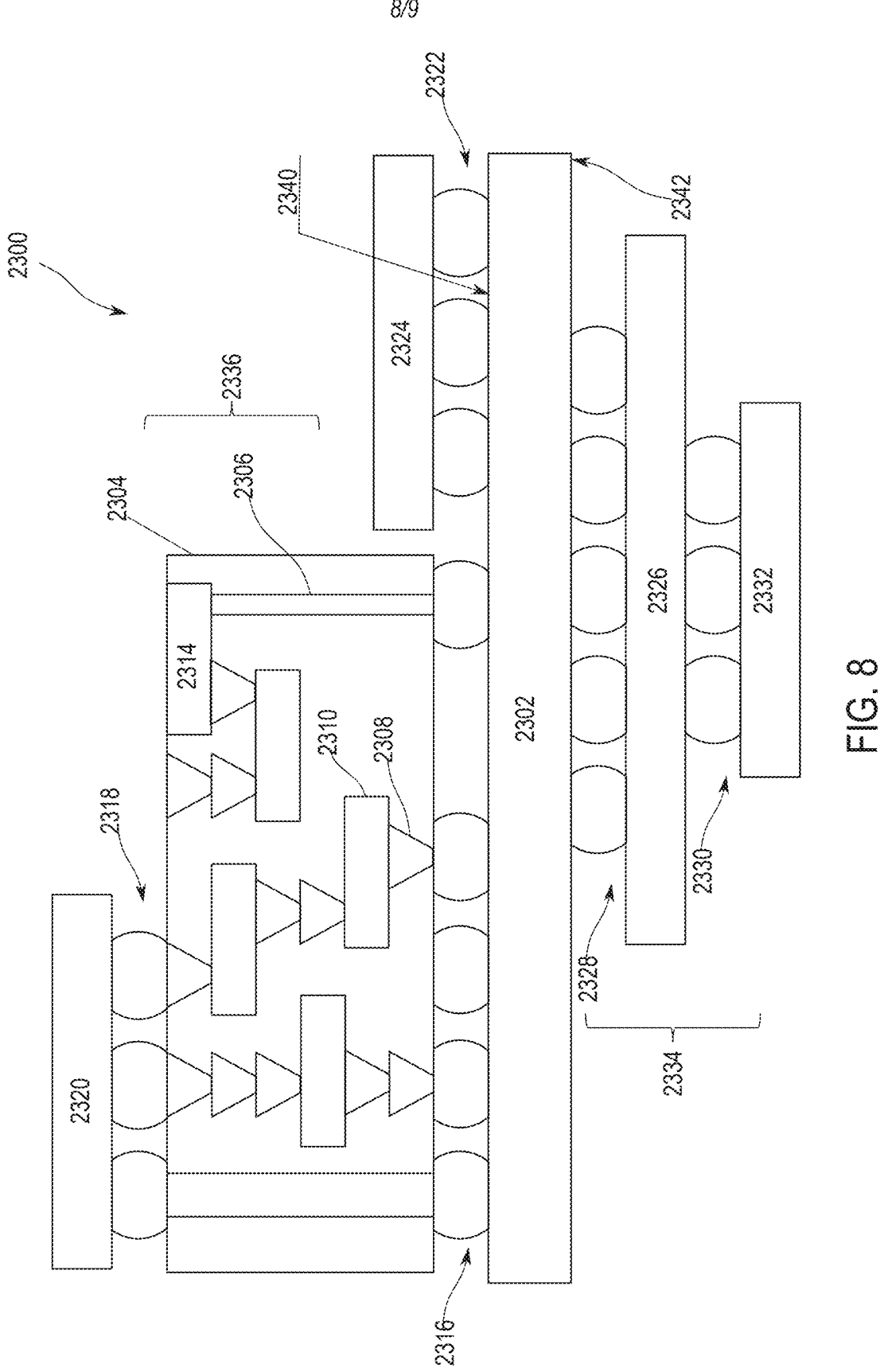
FIG. 8 is a cross-sectional side view of a device assembly that includes one or more microelectronic assemblies in accordance with any of the embodiments disclosed herein.
Figure 9:
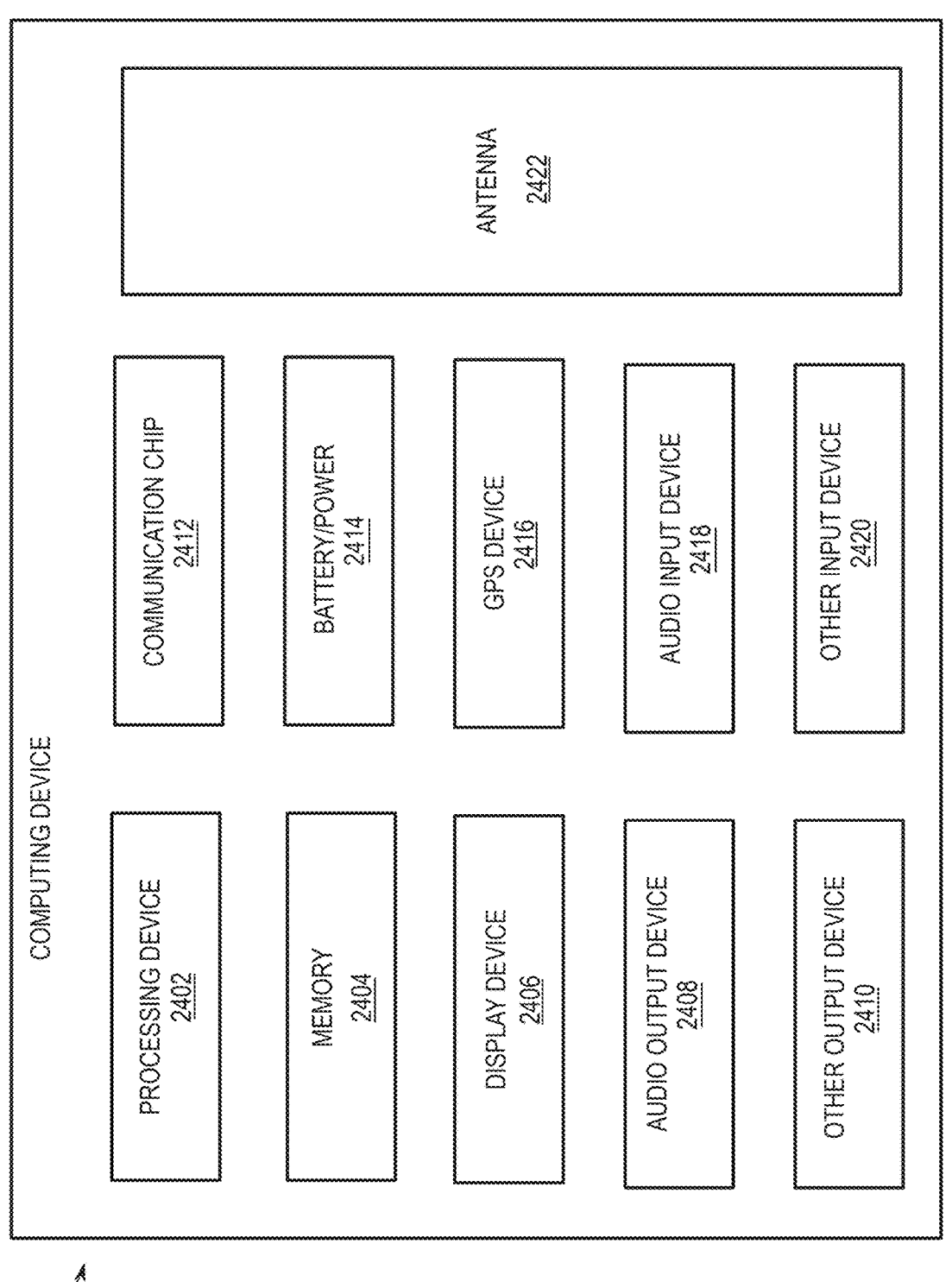
FIG. 9 is a block diagram of an example computing device that includes one or more microelectronic assemblies in accordance with any of the embodiments disclosed herein.

The packages disclosed herein, e.g., any of the embodiments shown in FIGS. 1-6C or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 8.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 7. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute crypto-graphic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio-frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100), comprising: an interposer (e.g., 102) having a first face (e.g., 104) and a second face (e.g., 106) opposite to the first face; a plurality of integrated circuit (IC) dies (e.g., 108) in a plurality of layers (e.g., 112) on the first face of the interposer, the plurality of IC dies being encased by a dielectric material (e.g., 114); a package substrate (e.g., 116) on the second face of the interposer; a plurality of conductive vias (e.g., 120) through the plurality of layers; and redistribution layers (e.g., 122) adjacent to the layers in the plurality of layers, at least some of the redistribution layers comprising conductive traces (e.g., 126) coupling the conductive vias to the IC dies.

Example 2 provides the microelectronic assembly of claim 1, wherein: the IC dies are coupled between adjacent layers by first interconnects (e.g., 110) having a first pitch, the interposer is coupled to the package substrate by second interconnects (e.g., 118) having a second pitch, and the first pitch is smaller than the second pitch.

Example 3 provides the microelectronic assembly of claim 2, wherein the IC dies form separate stacks (e.g., 130) through the layers, each stack being coupled to the interposer by the first interconnects.

Example 4 provides the microelectronic assembly of claim 3, wherein at least one stack in the separate stacks has a different number of IC dies than another stack in the separate stacks.

Example 5 provides the microelectronic assembly of claim 3, wherein all stacks in the separate stacks have the same number of IC dies.

Example 6 provides the microelectronic assembly of any one of examples 1-5, wherein the conductive traces (e.g., 126(1)) are further between the interposer and a layer in the plurality of layers, the layer being adjacent to the first face of the interposer.

Example 7 provides the microelectronic assembly of any one of examples 1-6, wherein the dielectric material is a mold compound.

Example 8 provides the microelectronic assembly of any one of examples 1-7, wherein at least one layer comprises a different dielectric material than another layer.

Example 9 provides the microelectronic assembly of any one of examples 1-8, wherein at least one IC die in the plurality of IC dies has through-substrate vias (TSVs) (e.g., 132).

Example 10 provides the microelectronic assembly of any one of examples 1-9, wherein the interposer has TSVs (e.g., 128).

Example 11 provides the microelectronic assembly of any one of examples 1-10, wherein the interposer comprises one of silicon, ceramic, and glass.

Example 12 provides the microelectronic assembly of any one of examples 1-11, wherein the interposer comprises active components.

Example 13 provides the microelectronic assembly of any one of examples 1-11, wherein the interposer does not comprise any active components.

Example 14 provides the microelectronic assembly of any one of examples 1-13, wherein a subset (e.g., 120(1), 120(2)) of the plurality of conductive vias has a larger diameter than another subset (e.g., 120(3)) of the plurality of conductive vias.

Example 15 provides the microelectronic assembly of any one of examples 1-13, wherein: a first subset of the conductive vias (e.g., 120(1)) is configured to carry power, a second subset of the conductive vias (e.g., 120(2)) is configured to carry signals, and a third subset of the conductive vias (e.g., 120(3)) is configured to connect to ground.

Example 16 provides the microelectronic assembly of any one of examples 1-13, wherein: a first subset of the conductive vias (e.g., 120(1)) is configured to operate at a first voltage (e.g., VDD1), a second subset of the conductive vias (e.g., 120(2)) is configured to operate at a second voltage (e.g., VDD2 or VSS), and the first voltage is different from the second voltage.

Example 17 provides the microelectronic assembly of any one of examples 1-16, wherein: a first subset of the conductive vias (e.g., 120(2), 120(3)) is distributed around the plurality of IC dies in a peripheral region of the dielectric material, and a second subset of the conductive vias (e.g., 120(1)) is distributed laterally between the plurality of IC dies in a medial region of the dielectric material.

Example 18 provides the microelectronic assembly of any one of examples 1-17, wherein the plurality of IC dies is contained within a boundary of the interposer.

Example 19 provides the microelectronic assembly of any one of examples 1-18, wherein any two conductive vias (e.g., 502, 504, FIGS. 5A, 5C, 6A, 6C) in contact with each other and extending through adjacent layers have a common center (e.g., 508).

Example 20 provides the microelectronic assembly of any one of examples 1-18, wherein any two conductive vias in adjacent layers do not have a common center (e.g., FIGS. 5B, 6B).

Example 21 provides the microelectronic assembly of any one of examples 1-20, wherein: a first subset of the conductive vias (e.g., 120(1), 120(2)) extends through a portion of the plurality of layers (e.g., 112(1), . . . 112(3)); and a second subset of the conductive vias (e.g., 120(3)) extends through another portion of the plurality of layers (e.g., 112(1), 112(2)).

Example 22 provides an IC package, comprising: a package substrate (e.g., 116); an interposer (e.g., 102) coupled to the package substrate on a first face (e.g., 106) of the interposer; and a plurality of IC dies (e.g., 108) on a second face (e.g., 104) of the interposer, the plurality being contained within a boundary of the interposer, wherein: the IC dies are arranged in more than two layers (e.g., 112), conductive vias (e.g., 120) extend through the layers on the second face of the interposer, and redistribution layers (e.g., 122) are adjacent to the layers, a portion (e.g., 126) of the redistribution layers coupling the conductive vias to the IC dies.

Example 23 provides the IC package of example 22, further comprising a mold compound (e.g., 114) encasing the plurality of IC dies on the second face of the interposer.

Example 24 provides the IC package of example 23, wherein the mold compound is contained within the boundary of the interposer.

Example 25 provides the IC package of any one of examples 23-24, wherein the mold compound has different material compositions in different layers.

Example 26 provides the IC package of any one of examples 22-24, wherein: the IC dies are in a plurality of stacks, at least one stack extending through the layers, and the conductive vias are distributed laterally between the stacks.

Example 27 provides the IC package of any one of examples 22-26, wherein at least one IC die comprises TSVs.

Example 28 provides the IC package of any one of examples 22-27, wherein the interposer is another IC die.

Example 29 provides the IC package of any one of examples 22-27, wherein the interposer comprises one of silicon, ceramic, and glass.

Example 30 provides the IC package of any one of examples 22-29, wherein the interposer comprises TSVs.

Example 31 provides the IC package of any one of examples 22-30, wherein: the IC dies in adjacent layers are coupled by die-to-die (DTD) interconnects (e.g., 110), and the interposer is coupled to the package substrate with die-to-package-substrate (DTPS) interconnects (e.g., 118).

Example 32 provides the IC package of example 31, wherein the DTD interconnects between any two adjacent layers contact the redistribution layer between the adjacent layers.

Example 33 provides a microelectronic assembly, comprising: a stack of IC dies (e.g., 130) comprising a first IC die (e.g., 108(1)) at a bottom of the stack, a second IC (e.g., 108(2)) die in a middle of the stack, and a third IC (e.g., 108(3)) die at a top of the stack, the first IC die coupled to the second IC die at a first interface by first interconnects (e.g., 110), and the second IC die coupled to the third IC die at a second interface by second interconnects (e.g., 110); a dielectric material (e.g., 114) encasing the stack; a first conductive via (e.g., 120(1)) on a first face of the stack, the first conductive via extending from the bottom of the stack to the top of the stack; a second conductive via (e.g., 120(3)) on a second face of the stack different from the first face, the second conductive via extending from the bottom of the stack to the first interface; a first redistribution layer (e.g., 126(2)) at the first interface; and a second redistribution layer (e.g., 126(3)) at the second interface, wherein: a first portion of the first redistribution layer couples the first conductive via to a first portion of the first interconnects, a second portion of the first redistribution layer couples the second conductive via to a second portion of the first interconnects, and a portion of the second redistribution layer couples the first conductive via to a portion of the second interconnects.

Example 34 provides the microelectronic assembly of example 33 (e.g., FIG. 4F), further comprising another stack of IC dies comprising a fourth IC die at a bottom of the another stack and a fifth IC die at a top of the another stack, the fourth IC die coupled to the fifth IC die at a third interface by third interconnects, wherein: the first interface is coplanar with the third interface, the first redistribution layer extends between the fourth IC die and the fifth IC die, and a third portion of the first redistribution layer couples the first conductive via to a first portion of the third interconnects.

Example 35 provides the microelectronic assembly of example 34, wherein the dielectric material further encases the another stack.

Example 36 provides the microelectronic assembly of any one of examples 33-35, wherein the stack of IC dies is coupled to an interposer (e.g., 102).

Example 37 provides the microelectronic assembly of any one of examples 33-36, wherein the first interconnects and the second interconnects comprise DTD interconnects having a pitch of less than 50 micrometers between adjacent interconnects.

Example 38 provides a method of fabricating a microelectronic assembly, the method comprising (e.g., FIGS. 4A-4F): providing an interposer having a first face and an opposing second face (e.g., FIG. 4A); forming a redistribution layer comprising conductive traces on the first face (e.g., FIG. 4A); attaching IC dies to the redistribution layer (e.g., FIG. 4B); depositing a dielectric material around the IC dies to form a layer over the interposer (e.g., FIG. 4B); planarizing an exposed surface (e.g., 422) of the layer opposite to the interposer (e.g., FIG. 4C); forming conductive vias in the layer; forming another redistribution layer comprising metal traces on the exposed surface (e.g., FIG. 4D); and repeating attaching IC dies, depositing the dielectric material, planarizing the exposed surface, forming the conductive vias, and forming another redistribution layer to generate successive layers until a desired arrangement of the microelectronic assembly is completed (e.g., FIGS. 4E-4F).

Example 39 provides the method of example 38, wherein planarizing the exposed surface comprises at least one of chemical mechanical polishing (CMP) and back-grinding.

Example 40 provides the method of any one of examples 38-39, wherein forming the conductive vias comprises depositing conductive pillars over the redistribution layer before attaching the IC dies (e.g., FIG. 4A), wherein at least a portion of the redistribution layer is in contact with the deposited conductive pillars.

Example 41 provides the method of example 40, wherein the deposited conductive pillars are taller than more than one layer, and successive layers are formed around the conductive pillars (e.g., FIG. 6C).

Example 42 provides the method any one of examples 38-39, wherein forming the conductive vias comprises etching through the dielectric material and plating conductive metal therein after planarizing the surface of the layer (e.g., FIGS. 5A-5C).

Example 43 provides the method of example 42, wherein the dielectric material extends through a plurality of the layers (e.g., FIG. 5C) and the etching extends through the plurality of the layers.

Example 44 provides the method of any one of examples 38-43, wherein the conductive vias in adjacent layers are not centered around a common center (e.g., FIGS. 5B, 6B).

Example 45 provides the method of any one of examples 38-43, wherein the conductive vias in adjacent layers are centered around a common center (e.g., FIGS. 5A, 6A).

Example 46 provides the method of any one of examples 38-45, further comprising curing the dielectric material.

Example 47 provides the method of any one of examples 38-46, wherein forming the redistribution layer comprises depositing a seed layer, depositing a conductive metal, and etching the conductive metal and the seed layer to form conductive traces.

Example 48 provides the method of any one of examples 38-46, wherein forming the redistribution layer comprises sputtering conductive metal to form the conductive traces.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
an interposer having a first face and a second face opposite to the first face;
a plurality of integrated circuit (IC) dies in a plurality of layers on the first face of the interposer, the plurality of IC dies being encased by a dielectric material;
a package substrate on the second face of the interposer;
a plurality of conductive vias through the plurality of layers; and
redistribution layers adjacent to the layers in the plurality of layers, at least some of the redistribution layers comprising conductive traces coupling the conductive vias to the IC dies;
wherein at least one IC die of the plurality of IC dies comprises a front metallization stack and a through silicon via (TSV) coupling the front metallization stack to a redistribution layer of the redistribution layers adjacent a back side of the at least one IC die.

2. The microelectronic assembly of claim 1, wherein:
the IC dies are coupled between adjacent layers by first interconnects having a first pitch,
the interposer is coupled to the package substrate by second interconnects having a second pitch, and
the first pitch is smaller than the second pitch.

3. The microelectronic assembly of claim 2, wherein the IC dies form separate stacks through the layers, each stack being coupled to the interposer by the first interconnects.

4. The microelectronic assembly of claim 1, wherein the dielectric material is a mold compound.

5. The microelectronic assembly of claim 1, wherein the interposer comprises one of silicon, ceramic, and glass.

6. The microelectronic assembly of claim 1, wherein conductive vias in a subset of the plurality of conductive vias have larger diameters than conductive vias in another subset of the plurality of conductive vias.

7. The microelectronic assembly of claim 6, wherein:
a first subset of the conductive vias is configured to operate at a first voltage,
a second subset of the conductive vias is configured to operate at a second voltage, and
the first voltage is different from the second voltage.

8. The microelectronic assembly of claim 1, wherein the plurality of IC dies is contained within a boundary of the interposer.

9. The microelectronic assembly of claim 1, wherein any two conductive vias in contact with each other and extending through adjacent layers have a common center.

10. The microelectronic assembly of claim 1, wherein any two conductive vias in adjacent layers do not have a common center.

11. An IC package, comprising:
a package substrate;
an interposer coupled to the package substrate on a first face of the interposer; and
a plurality of IC dies on a second face of the interposer, the plurality being contained within a boundary of the interposer, wherein:

the IC dies are arranged in more than two layers, conductive vias extend through the layers on the second face of the interposer, and redistribution layers are adjacent to the layers, a portion of the redistribution layers coupling the conductive vias to the IC dies;

wherein at least one IC die of the plurality of IC dies comprises a front metallization stack and a through silicon via (TSV) coupling the front metallization stack to a redistribution layer of the redistribution layers adjacent a back side of the at least one IC die.

12. The IC package of claim 11, further comprising a mold compound encasing the plurality of IC dies on the second face of the interposer.

13. The IC package of claim 12, wherein the mold compound has different material compositions in different layers.

14. The IC package of claim 11, wherein:

the IC dies are in a plurality of stacks, at least one stack extending through the layers, and the conductive vias are distributed laterally between the stacks.

15. The IC package of claim 11, wherein the interposer is another IC die.

16. The IC package of claim 11, wherein the interposer comprises TSVs.

17. The IC package of claim 11, wherein:

the IC dies in adjacent layers are coupled by die-to-die (DTD) interconnects, and the interposer is coupled to the package substrate with die-to-package-substrate (DTPS) interconnects.

18. A method of fabricating a microelectronic assembly, the method comprising:

providing an interposer having a first face and an opposing second face;

forming a redistribution layer comprising conductive traces on the first face;

attaching IC dies to the redistribution layer;

depositing a dielectric material around the IC dies to form a layer over the interposer;

planarizing an exposed surface of the layer opposite to the interposer;

forming conductive vias in the layer;

forming another redistribution layer comprising metal traces on the exposed surface; and repeating attaching IC dies, depositing the dielectric material, planarizing the exposed surface, forming the conductive vias, and forming another redistribution layer to generate successive layers until a desired arrangement of the microelectronic assembly is completed, wherein at least one IC die of the IC dies comprises a front metallization stack and a through silicon via (TSV) coupling the front metallization stack to the redistribution layer adjacent a back side of the at least one IC die.

19. The method of claim 18, wherein forming the conductive vias comprises depositing conductive pillars over the redistribution layer before attaching the IC dies, wherein at least a portion of the redistribution layer is in contact with the deposited conductive pillars.

20. The method of claim 18, wherein forming the conductive vias comprises etching through the dielectric material and plating conductive metal therein after planarizing the surface of the layer.

* * * * *